United States Patent [19]

Vu et al.

[11] Patent Number: 5,758,274
[45] Date of Patent: May 26, 1998

[54] RADIO FREQUENCY RECEIVER WITH AUTOMATIC GAIN CONTROL

[75] Inventors: Hoai X. Vu, Stanton, Calif.; Toan Vu, Lake Grove, N.Y.

[73] Assignee: Symbol Technologies, Inc., Holtsville, N.Y.

[21] Appl. No.: 615,347

[22] Filed: Mar. 13, 1996

[51] Int. Cl.$^6$ .................................................. H04B 1/16
[52] U.S. Cl. ........................ 455/246.1; 455/234.2
[58] Field of Search ............................. 455/232.1, 234.1, 455/234.2, 241.1, 246.1, 247.1, 250.1, 254, 239.1, 240.1, 245.2; 375/345; 330/278, 291

[56] References Cited

U.S. PATENT DOCUMENTS

| | | | |
|---|---|---|---|
| 4,789,995 | 12/1988 | Hurst et al. | 375/345 |
| 4,989,074 | 1/1991 | Matsumoto | 455/234.1 |
| 5,276,685 | 1/1994 | Kepler et al. | 455/234.1 |
| 5,353,305 | 10/1994 | Fukuda et al. | 375/231 |
| 5,408,698 | 4/1995 | Serizawa et al. | 375/345 |

OTHER PUBLICATIONS

IEEE Journal of Solid–State Circuits, vol. 25, No. 1, Feb. 1990, pp. 312–315 "A 300–MHZ CMOS Voltage Controlled Ring Oscillator" by S.K. Enam and Asad A. Abidi.

*Primary Examiner*—Nguyen Vo

[57] ABSTRACT

The receiver for receiving data carried by the carrier frequency signal and, in a heterodyning system, for downconverting the received signal to a suitable intermediate frequency signal. The modulator and the downconverter are formed on a single semiconductor body, or chip of silicon. The receiver section is adapted to receive, over a predetermined overall bandwidth, signals having carrier frequencies within a plurality of frequency channels, each one of the channels having a predetermined channel bandwidth. The downconverted signals are converted into corresponding digital signals. A demodulator includes a pair of filters having Hilbert-Transform relationship with respect to each other. The receiver includes: a first automatic gain control circuit (AGC) which is responsive to an output of the digital signal processor, for adjusting the gain of the AGC circuit in accordance with the output of the digital signal processor; and, a second AGC circuit fed by the digital signals and the output of the digital signal processor, for adjusting the gain of the magnitude of the digital signals in accordance with the output of the digital signal processor.

3 Claims, 12 Drawing Sheets

RADIO FREQUENCY RECEIVER WITH AUTOMATIC GAIN CONTROL

BACKGROUND OF THE INVENTION

This invention relates generally to radio frequency transceivers and more particularly to transceivers having the receiver section and a portion of the transmitter section thereof adapted for fabrication on a single chip of silicon.

As is known in the art, transceivers include a transmitter section and a receiver section. The transmitter section includes a modulator to superimpose information, i.e., data, onto a suitable radio frequency (RF) carrier signal, such as a microwave frequency carrier signal. The receiver section receives data carried by the carrier frequency signal and, in a heterodyning system, downconverts the received signal to a suitable intermediate frequency signal. Signals having frequencies above the intermediate frequency are then removed by a low pass filter. The data is then extracted from the intermediate frequency signals passed by the low pass filter using a demodulator.

As is also known in the art, it would be desirable to fabricate such transceivers using integrated circuit fabrication techniques. One technique used today is to form the portions of the transceiver which operate at microwave frequencies, (i.e., the modulator and downconverter) on a gallium arsenide, GaAs, chip and the portions of the transceiver which operate at the intermediate frequency, or lower (i.e., the demodulator) on a silicon, Si, chip. While such transceivers are useful in some applications, they are too large in other applications, and because they use GaAs, are relatively expensive.

As is also known in the art, one type of transceiver is adapted to transmit data on a selected one of a plurality of frequency channels and is likewise adapted to receive signals on a selected one of the plurality of signal channels. Further, in such transceiver, the received signals in a selected one of the channels are downconverted to the intermediate frequency and demodulated using two locally generated oscillator signals in quadrature phase relationship as when digital signal processing techniques are used to demodulate, or extract, the data from a selected carrier frequency signal. Accurately generating two quadrature phase local oscillator signals is expensive and difficult.

As is also known in the art, when digital signal processing is used, samples of the intermediate frequency signal are taken and then converted into corresponding digital signals. Further, the frequency spectrum of the sampled signals repeats at the sampling frequency and its harmonics. Therefore, if the receiver is adapted to receive signal over a predetermined band of frequencies, or a predetermined overall bandwidth, over which the plurality of frequency channels extend, the signals are sampled at a frequency, or rate, greater than twice the predetermined bandwidth in order to prevent aliasing, i.e., prevent frequency components of signals in an unselected channel from folding into the pass band of the low pass filter. This minimum sampling frequency is referred to as the Nyquist sampling frequency. It follows then that as the bandwidth over which the receiver channels extend increases, the Nyquist sampling frequency correspondingly increases thereby placing severe sampling frequency requirements on the sampler, or else requiring a limitation in the predetermined overall bandwidth of the transceiver.

As is also known in the art, the receiver section of such transceivers usually includes an analog automatic gain control (AGC) circuit to maintain the strength of the signal being processed at some predetermined level independent of variations in the strength of the received signal. In one AGC circuit, the intermediate frequency signal is fed to an amplifier. The gain of the amplifier is adjusted in accordance with the power of the demodulated signal. Thus, with such arrangement, the analog AGC circuit is used to adjust the strength of an analog signal, i.e., the intermediate frequency signal. As noted above, in some application, digital signal processing techniques are used in the demodulation process. There, the AGC'd analog signal is digitized then fed to a digital signal processor for demodulation. While such AGC'ing technique may be satisfactory in many such digital processing applications, in other such applications, the analog AGC circuit may not provide sufficient gain to prevent undesired computational round-off errors in the digital processing.

As is also known in the art, oscillators are used to generate a signal having a frequency selected in accordance with an applied control signal (i.e., a voltage controlled oscillator, VCO). One technique used to fabricate such VCO is with a ring of serially connected inverters as described in FIG. 3 of an article entitled "A 300-MHZ CMOS Voltage-Controlled Ring Oscillator" by S. K. Enam and Asad A. Abidi, IEEE Journal of Solid State Circuits Vol. 25, No. 1, February 1990. Each inverter in the ring VCO includes an n channel transistor (nMOS transistor) connected in a totem pole arrangement to a p channel transistor (pMOS transistor). The gates of the nMOS and pMOS transistors are connected together to provide a common input for the inverter and the drain and source of the pMOS and nMOS transistors are connected together to provide an output for the inverter. The ring VCO has an inner ring with an odd number of inverters and an outer ring, fed by an output of the inner ring, having an even number of inverters. The outer and inner rings feed a pair of transistors having gates connected to a control voltage. The pair of transistors are arranged to provide a potentiometer which vectorially adds the signals produced by the inner and outer rings in a proportion selected by the control signal. The inner ring provides a signal which oscillates at the highest frequency of the VCO and the outer ring produces a signal which oscillates at the lowest VCO frequency. The pair of potentiometer-arranged transistors produce an output signal having a frequency intermediate between these two extremes. The frequency of oscillation is determined by the total propagation delay through each ring and the control voltage. More particularly, the transistors in each inverter circuit are driven periodically at the frequency of oscillation into complementary conducting/nonconducting states. Because pMOS transistors switch between conducting/non-conducting states slower than nMOS transistors, the oscillation frequency of the inner ring, i.e., the maximum frequency, is constrained by the gain-bandwidth capability of the pMOS transistors.

SUMMARY OF THE INVENTION

In accordance with the present invention a transceiver is provided having a transmitter section and a receiver section. The transmitter section includes a modulator to superimpose information, i.e., data, onto the amplitude of a suitable carrier signal, such as a microwave frequency carrier signal. The receiver section receives data carried by the carrier frequency signal and, in a heterodyning system, downconverts the received signal to a suitable intermediate frequency signal. The modulator and the downconverter are formed on a single semiconductor body, or chip of silicon.

In a preferred embodiment of the invention, the microwave frequency is in the order of several gigahertz and the modulator and downconverter are formed using CMOS technology with the transistors thereof having gate channel lengths shorter than 1 micrometer.

In accordance with another feature of the invention, a system is provided having: a receiving section adapted to receive over a predetermined overall bandwidth, signals having carrier frequencies within a plurality of frequency channels, each one having a predetermined channel bandwidth; and, a sampler for sampling such received signals at a sampling frequency less than twice the predetermined overall bandwidth. The sampling frequency is selected to convert the carrier frequency of a signal within a selected one of the frequency channels to a predetermined intermediate frequency and to convert the carrier frequencies of signals of the un-selected ones of the frequency channels to frequencies other than the predetermined intermediate frequency.

In a preferred embodiment, the channels have a predetermined frequency separation, $\delta$, a predetermined channel bandwidth, $f_b$, no more than $\delta/2$, and the sampling frequency, $f_s$, is selected to produce an intermediate frequency, $f_{if}$, less than $\delta$. In a preferred embodiment, $f_{if}$ is equal:

($\delta/4$) ($2L+1$);

where L in an integer equal to, or greater than, 0. Preferably, L=0 and therefore the intermediate frequency, $f_{if}=\delta/4$. Thus, $$f_s = \frac{4f_c - \delta}{4K} \geq N\delta \quad (1)$$

where N is the number of channels, $f_c$, is the carrier frequency of the selected one of the frequency channels and K is a constant. To minimize the sampling frequency, K is the largest integer satisfying the following equation:

$$K = MAX \left[ k\epsilon I : k \leq \frac{(4f_c/\delta) - 1}{4N} \right] \quad (2)$$

where I is the set of positive integers.

In accordance with another feature of the invention, a low pass filter is provided for selectively passing only those frequencies less than $\delta/2$, or preferably, less than, $\delta/4+(f_b/2)$, to a demodulator. In a preferred embodiment, the passed signals are converted into corresponding digital signals. The demodulator includes a Hilbert-Transform-pair filter section. More particularly, the filter section includes: a pair of Hilbert-Transform-pair filters fed by the digitized, intermediate frequency signal passed by the low pass filter; a pair of multipliers fed by the outputs of the Hilbert-Transform-pair filters for producing signals representative of the square of the digitized signals fed to such multipliers; and, an adder for adding the signals produced by the each multiplier to produce the demodulated signal.

In accordance with another feature of the invention, a receiver is provided having a digitizer section for converting the intermediate frequency signals passed by the low pass filter into corresponding digital signals; and, a digital signal processor for processing the digital signals. The receiver includes: a first automatic gain control circuit (AGC), fed by the low-pass filtered intermediate frequency signals and responsive to an output of the digital signal processor, for adjusting the gain of the AGC circuit in accordance with the output of the digital signal processor; and, a second AGC circuit fed by the digital signals and the output of the digital signal processor, for adjusting the magnitude of the digital signals in accordance with the output of the digital signal processor. In a preferred embodiment of the invention, the output of the demodulator is used to provide the control signal for the first and second AGC circuits.

In accordance with still another feature of the invention, an oscillator is provided having a plurality of cascade coupled inverters. Each one of the inverters is a differential amplifier having a p-input and an n-input. The output of each one of the amplifiers is connected to: the n-input of the next succeeding amplifier to provide a closed loop, or ring oscillator; and, the p-input of an amplifier positioned an even number of amplifier stages forward of such amplifier. In a preferred embodiment, each amplifier in the ring includes an n channel transistor (nMOS transistor) connected in a totem pole arrangement, to a p channel transistor (pMOS transistor). The gate of the nMOS transistor provides the n-input and gate of the pMOS transistor provides the p-input. The source and the drain of the pMOS and nMOS transistors are connected together to provide an output for the amplifier. With such arrangement, because the gate of the more slowly responding pMOS transistor is driven before the gate of the pMOS transistor the oscillator is adapted to operate at a higher frequency of oscillation.

In one embodiment, the ring oscillator provides the inner, higher oscillation frequency, ring of a two ring VCO. The outputs of the two rings are combined in a transistor circuit arranged to provide for vectorially adding the signals produced by the two rings in proportion dictated by a control signal. In one arrangement the second outer ring includes at least two inverters and in another embodiment the outer ring includes a transistor have a gate geometry selected to provide the signal produced in the outer ring with the minimum frequency for the VCO.

DESCRIPTION OF THE PREFERRED EMBODIMENTS

TRANSCEIVER—GENERAL OVERVIEW

Figure 1:
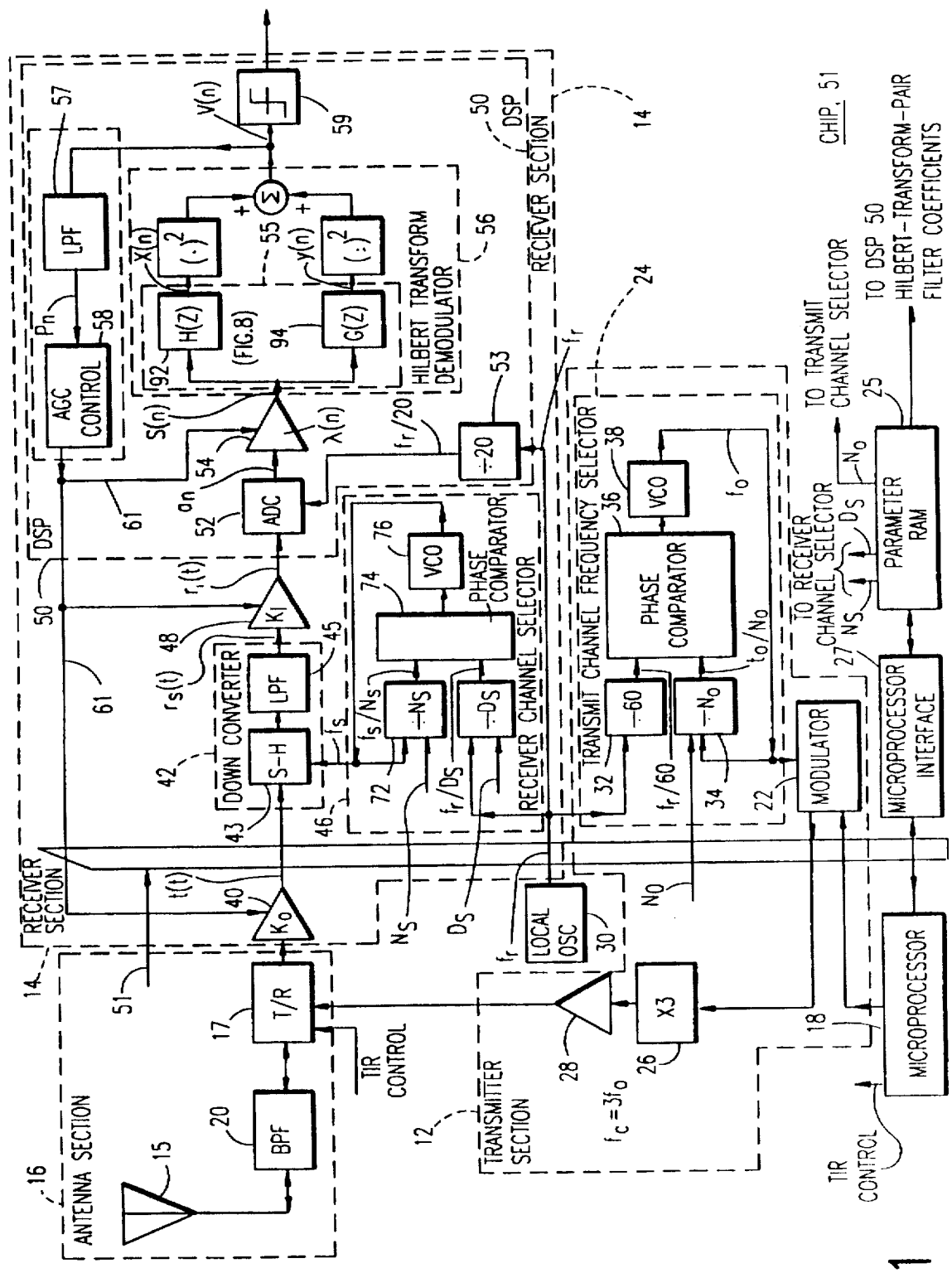
FIG. 1 is a block diagram of a transceiver according to the invention.

Referring now to FIG. 1, a transceiver 10 is provided having a transmitter section 12 and a receiver section 14 coupled to an antenna section 16. The antenna section 16 includes: an antenna 15; a conventional transmit/receive (T/R) switch 17 controlled by a T/R control signal from microprocessor 18 to place the transceiver 10 in either the transmit (T) mode or the receive (R) mode; and, an image rejection bandpass filter 20, as shown.

TRANSMITTER SECTION 12

The transmitter section 12 includes: a modulator 22; a transmit channel frequency selector 24; a frequency multiplier 26 and a power amplifier 28 arranged as shown. Modulator 22 is here an on-off keyed amplitude modulation (AM) modulator to superimpose information, (i.e., binary data), from the microprocessor 18 onto the amplitude of a suitable radio frequency (RF) carrier signal, such as a microwave frequency carrier signal. Here, the transmitter section 12 is adapted to transmit the data on a selected one of a plurality of carrier frequency channels. The carrier frequency is selected by a transmit channel selector 24 in response to data read from a parameter random access memory (RAM) 25. The RAM 25 is read in response to signals fed thereto from microprocessor 18 via microprocessor interface 27. Here, the transmit channel selector 24 produces a signal having a frequency one third the frequency of the transmitted carrier signal. Therefore, the modulated signal is fed to the frequency multiplier 26, here a times three frequency multiplier, to produce the transmitted carrier frequency, $f_c$, after passing through the power amplifier 28 to the T/R switch 17, the band pass filter 20 and antenna 15. Here, the signal produced by the transmit channel selector 24 has a frequency in one of 100 equally spaced frequency channels extending from 800.33 MHz to 833.33 MHz. Therefore, the times three frequency multiplier 28 upconverts the signal produced by the transmit channel selector 24 to 2.401 GHz to 2.500 GHz, respectively, resulting in 100 equally spaced frequency channels $200_1$–$200_N$ the frequency spectra, R(f) being shown in FIG. 2A. It is noted that because the signals transmitted are "real" signals, the transmit frequency spectrum has both positive and negative frequency components, as shown.

More particularly, transmit channel selector 24 is fed by a local oscillator 30, here a crystal oscillator which produces a local oscillator frequency, $f_r$, here 20 MHz±20 ppm). The transmit channel selector 24 has two frequency dividers, a divide by 60 frequency divider 32 fed by the local oscillator signal $f_r$ to produce a signal having a frequency $f_r/60$, here 0.33 MHz, and a divide by $N_o$ frequency divider 34, where $N_o$ is an integer provided by the microprocessor 18 to select the carrier frequency $f_{C1}$–$f_{CN}$ to be transmitted. The output signals produced by the frequency dividers 32, 34 are fed to a phase comparator 36. A signal representative of the phase difference in the two signals are used to control a voltage controlled oscillator 38, the details of which will be described in connection with FIGS. 3, 4 and 5. Suffice it to say here, however, that the signal produced by the VCO 38 is fed back to the divide by $N_o$ frequency divider 34 to provide a phase locked loop. That is, in the steady state, the frequency, produced by the divide by $N_o$ frequency divider 34 will be forced equal to $f_r/60$. Thus, the frequency, $f_o$, of the signal produced by the VCO 38 will be forced equal to $(N_o/60)$ $(f_r)$, here $N_o/3$ MHz. The signal produced by the VCO 38 is fed to the modulator 22 and, as noted above, has a frequency one third of the selected carrier frequency, $f_c$, used to transmit the data. Thus, here $N_o$ is one of 100 integers ranging from 2401, 2402, ... 2500.

RECEIVER SECTION 14

The receiver section 14 includes: a low noise amplifier 40; a downconverter 42, here including a sample-hold circuit 43 and low pass filter 45; a receiver channel selector 46; a coarse AGC circuit 48; and a digital signal processor (DSP) 50. The receiver channel selector 46 will be described in detail hereinafter. Suffice it to say here however that the receiver channel selector 46 provides sampling signals at a sampling frequency, $f_s$, for the sample-hold circuit 43 to downconvert the carrier frequency of a received signal within a selected one of the plurality of frequency channels, $200_1$–$200_N$, to a predetermined intermediate frequency, $f_{if}$, here δ/4, where is the adjacent channel carrier frequency separation between channels $200_1$–$200_N$. Here, δ=1 MHZ and therefore $f_{if}$ is here 250 KHz.

The digital signal processor 50 includes: an analog to digital converter (ADC) 52 sampled by signals from a frequency divider 53, here a divide by 20 frequency divider fed by the local oscillator 30; a fine AGC circuit 54; a demodulator 56, here having a pair of Hilbert-Transform-pair filters in filter section 55, to be described in detail hereinafter, for recovering the baseband data from the downconverted, intermediate frequency signal passed by low pass filter 45; an AGC control 58, responsive to the power in the demodulated signal, for adjusting the gains in the coarse AGC circuit 48, fine AGC circuit 54, and low noise amplifier 40, in a manner to be described in detail hereinafter and, a threshold circuit 59. It should be noted that the modulator 22, downconverter 42, receiver channel selector 46, transmit channel selector 24 digital signal processor 56, microprocessor interface 25, parameter RAM 25, and twenty to one frequency divider 53 are formed on a single semiconductor body, or chip 51. Here, the semiconductor body is silicon and such circuits are formed using CMOS technology with the transistors thereof having gate channel lengths in the order of one micrometer. (It should be noted that while the active elements, i.e., transistors, are formed on the chip 51, some passive elements, i.e., resistors and capacitors, not shown, used for a low pass filter 45 of downconverter 42 and VCOs 38, 76, to be described, are external to the chip 51 and are interconnected by contact pads on the chip 51 in a conventional manner).

DOWNCONVERTER 42

The downconverter 42, as noted above includes: a sample-hold circuit 43, sampled by signals generated by the receiver channel selector 46; and, a bandpass filter 45. The sampling frequency, $f_s$, fed to the sample-hold circuit 43 has a selected one of 100 sampling frequencies. Each one of the 100 selectable sampling frequencies results in the received microwave signal fed thereto being down converted to a common intermediate frequency, here 250 KHz. Thus, the receiver has a plurality of, here 100, selectable frequency channels, each one thereof being selected by the correspondingly distinct frequency of the sampling signal. Each one of the channels has a predetermined bandwidth, here $f_b$. It should be noted that, for reasons to be described, the sampling frequency, $f_s$, which is less than twice the predetermined overall bandwidth, is selected to convert the frequency of a signal within a selected one of the frequency channels to the intermediate frequency, $f_{if}$, here 250 KHz, and to convert the frequencies of signals in the unselected channels to frequencies greater than the intermediate frequency $f_{if}$. It is noted that, regardless of which one of the frequency channels $200_1$–$200_N$ is selected, the effect of the sampling frequency, $f_s$, is to convert the frequency of the signal in the selected one of the frequency channels to the same intermediate frequency, $f_{if}$.

More particularly, the sampling frequency $f_s$ is selected by the receiver channel selector 46 responding to signals $N_S$.

$D_S$ provided by the microprocessor 18 through interface 27 and RAM 25. Given that the receiver frequency channels have a predetermined frequency separation, $\delta$, here 1 MHz; the sampling frequency, $f_s$, is given by:

$$f_s = \frac{4f_c - \delta}{4K} \geq N\delta \quad (3)$$

where $f_c$ is the carrier frequency of the selected frequency channel and K is a computed positive constant selected to translate the desired carrier frequency channel to within the pass band of the low pass filter 45 and to translate the frequencies of the undesired channels outside of the pass band of low pass filter 45.

Figure 2A:
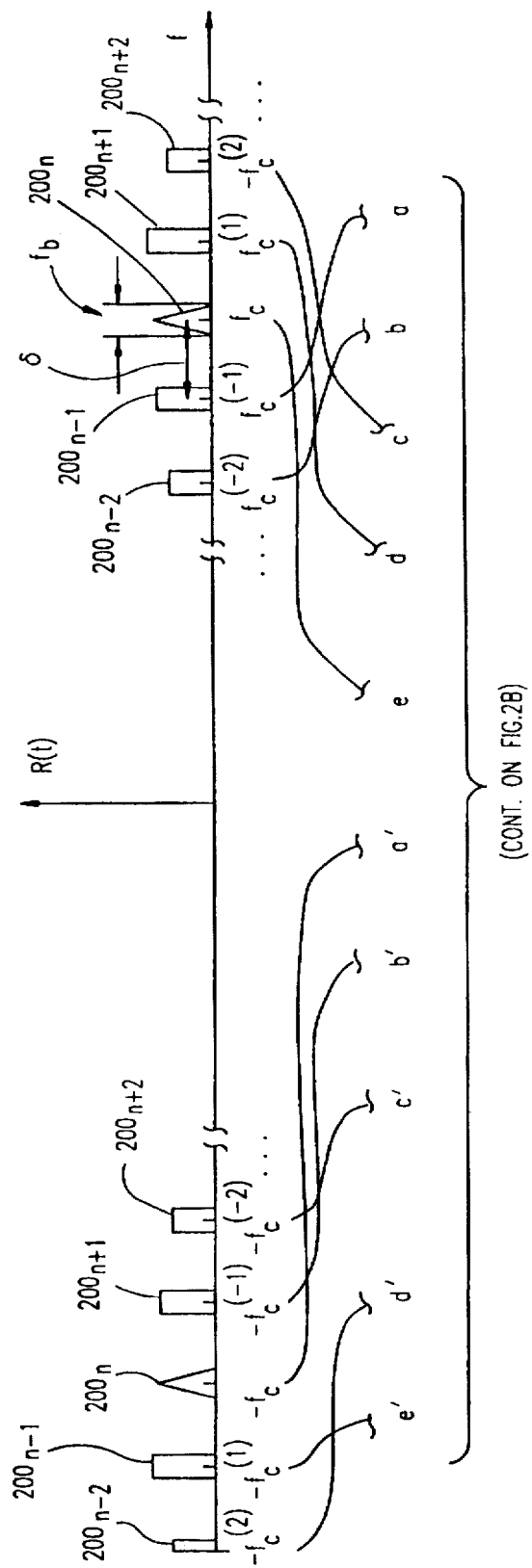
FIG. 2A is the frequency spectrum of a plurality of frequency channels adapted to be transmitted, or received by, the transceiver of FIG. 1.
Figure 2B:
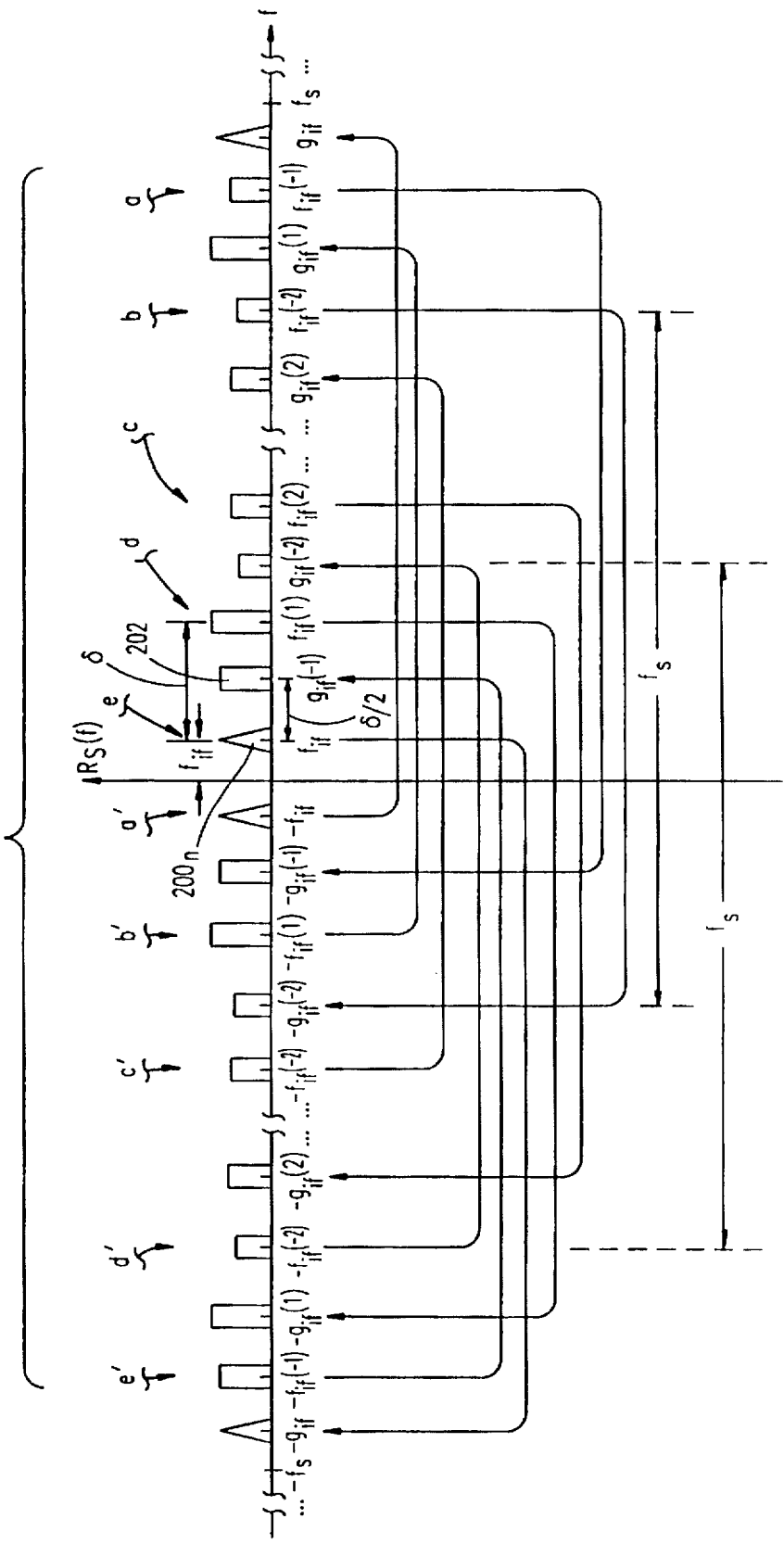
FIG. 2B is the frequency spectrum of signals after a selected one of the received channels has been sampled and downconverted by the transceiver of FIG. 1.

Referring to FIGS. 2A and 2B, the frequency spectrum R(f) of the received signal r(t) produced at the output of low noise amplifier 40 contains N channels $200_1$, $200_2$, ..., $200_n$, ..., $200_N$ spaced by a constant frequency separation $\delta$ and N=100. Sample and hold circuit 43 of downconverter 42 (FIG. 1) samples r(t) to produce duplicates of R(f) at multiples of the sampling frequency $f_s$ in the sample hold circuit 43; i.e. having a sampled frequency spectrum, $R_s(f)$, as shown in FIG. 2B. As a result, a channel of interest $200_n$, (i.e., the selected one of the N channels) with symmetric components at the carrier frequencies $f_c$ and $-f_c$ is shifted to intermediate frequencies $f_{if}$, $-f_{if}$ and frequencies spaced from $f_{if}$ by multiples of the sampling frequency $f_s$.

The sample hold circuit 43 therefore shifts channel $200_n$ to the lowest intermediate frequency ($f_{if} = \delta/4$) that maximizes the separation between channels in the downconverter 42, (i.e., the sampled signal frequency spectrum, $R_s(f)$). Choosing $f_s$ in the manner to be described causes the signals in the unselected channels in $R_s(f)$ to shift to frequencies greater than the intermediate frequency, $f_{if}$, here greater than $\delta/4=250$ KHz plus half the bandwidth $f_b$ of the channel. That is, as noted above, the bandwidth, $f_b$, of each one of the channels $200_1$–$200_N$ is less than half the channel separation, $\delta$. That is, each channel $200_1$–$200_N$ has a bandwidth, $f_b$, less than $\delta/2$, here less than 500 KHz. The low pass filter 45 has a center frequency of dc (i.e., zero frequency) and a bandwidth less than $\pm(\delta/2)$. Therefore, the signal in the selected one of the channels $200_1$–$200_N$, here the channel of interest $f_n$, being at $f_{if}$ and having a bandwidth within the pass band of the low pass filter 45 will pass through the low pass filter 45 while the signals in the unselected channels will be rejected by the filter 45 for further processing because the nearest channel will have a center frequency of $f_{if}+(\delta/2)=3\delta/4$.

The intermediate frequency $f_{if}$ that maximizes channel separation in the downconverted signal $r_s(t)$ is given by:

$$f_{if} = \frac{\delta}{4}(2L+1) \quad (4)$$

where L is a non-negative integer. Choosing L=0 minimizes $f_{if}$, giving an optimal value of:

$$f_{ifopt} = \delta/4 \quad (5)$$

For example, for a channel separation ($\delta$) of 1 MHz, the optimal intermediate frequency, $f_{if}$, is 250 kHz. This low intermediate frequency allows the processor to employ low-frequency, low-cost components.

The optimal sampling frequency is given by:

$$k \leq (4(f_c/\delta)-1)/4N \quad (6)$$

where N is the number of channels in the received signal r(t), $\delta$ is the separation between channels, $f_c$ is the carrier frequency of the selected one of the channels; and, K is the largest integer k satisfying:

$$k \leq \frac{4f_c/\delta - 1}{4N} \quad (7)$$

Other values of K may be chosen that satisfy the inequality given in Equation (7). However, choosing K as the largest integer k minimizes the sampling frequency, and thus reduces the cost of downconverter 42. In addition, requiring the sampling frequency to be larger than N$\delta$ ensures adequate separation between channels in the sampled signal $R_s$ (f).

Choosing an intermediate frequency of one-quarter the channel separation ensures that each interleaved channel is centered between adjacent channels in the sampled spectrum $R_s(f)$. In other words, the separation between channels in $R_s(f)$ is equal to $\delta/2$, and is constant. If a slightly different intermediate frequency is chosen, e.g., $\delta/4+\epsilon$, interleaved channel 202 will be placed closer to one adjacent channel ($200_n$, $200_{n+1}$) than another. This will increase the likelihood of spectral distortion, especially when the bandwidth of each channel is relatively large.

The sampling aperture of the sample hold circuit 43 is chosen to be small in order to minimize mixer conversion loss and spectral distortion. The sampling aperture $\tau$ of the mixer is defined by the Fourier transform H(f) of its impulse response, given by:

$$H(f) = \tau \sin c(f\tau)e^{-j\pi f\tau} \quad (8)$$

RECEIVER CHANNEL SELECTOR 46

The receiver channel selector 46 includes a divide by $D_S$ frequency divider 70 fed by the local oscillator 30 signal having the frequency, $f_r$, and a divide by $N_S$ frequency divider 72, arranged in a similar manner as the transmit channel selector 24. Thus, the output signals of the pair of frequency dividers 72, 70 are fed to a phase comparator 74, the output signal thereof providing the control signal for a voltage controlled oscillator (VCO) 76. The output of the VCO 76 is fed back to the divide by $N_S$ frequency divider 72 and serves as the receiver frequency channels selector (more specifically as the sampling signal for the sample hold circuit 43 in the down converter 42). Thus, in the steady state, the frequency of the signal produced by the divide by $N_S$ frequency divider 72, i.e., $f_s/N_S$, will be equal to $f_r/D_S$. That is, in the steady state, the sampling frequency, $f_s=(f_r)(N_S/D_S)$, here 20$(N_S/D_S)$ MHz. As noted above, here:

$$f_s = \frac{4f_c - \delta}{4K} = \frac{4(f_c/\delta) - 1}{4K}\delta \quad (9)$$

Thus, because here $\delta=1$ MHz and $f_c$ ranges from 2.401 GHz to 2.500 Ghz, here K=24. Further, because here the sampling frequency, $f_s$, is generated from the local oscillator having a frequency, $f_r$, here 20 MHz, $f_r=20\delta$:

$$f_s = \frac{4(f_c/\delta) - 1}{80K} f_r = \frac{N_s}{D_s} f_r \quad (10)$$

Thus, here K=24 and $D_S$ is 1920 and $N_S$ is 9603, 9607, 9611, ... 9999, for tuning the receiver to channels 1 through 100, respectively.

As discussed above, the low pass filter 45 of the downconverter 42, as noted above, has a 480 KHz cutoff frequency and therefore selectively passing only those frequencies less than $\delta/2$, to demodulator 56 for demodulation after conversion to corresponding digital signals. Thus, low pass filter 45 passes only signals from the selected one of the frequency channels because the sample hold circuit 43 translates the frequencies of the signals in all unselected frequency channels to frequencies greater than $\delta/2$.

VOLTAGE CONTROLLED OSCILLATORS 36, 38

Figure 3:
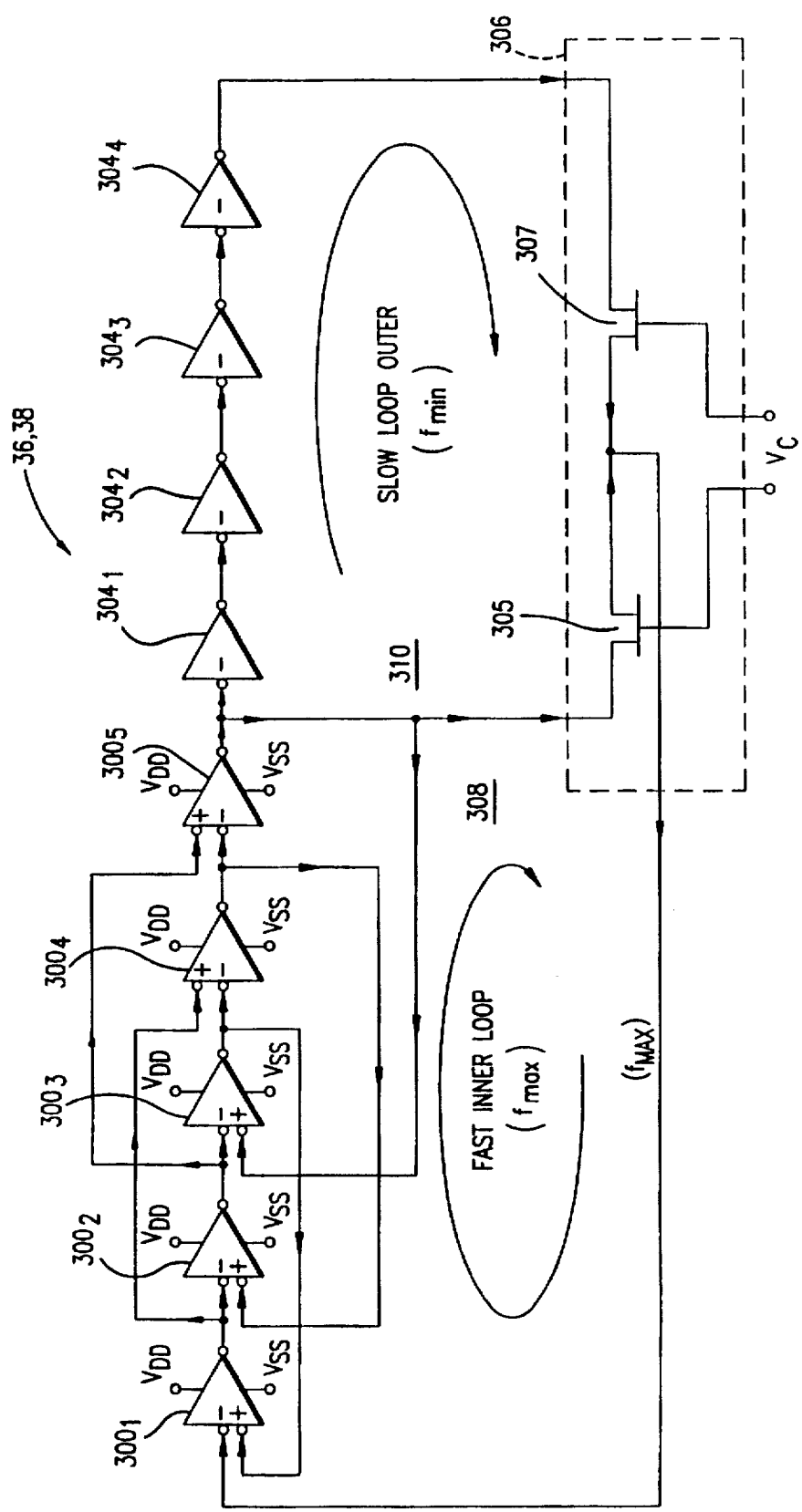
FIG. 3 is a block diagram of a voltage controlled oscillator (VCO) according to the invention, such VCO being used in the transceiver of FIG. 1.
Figure 4:
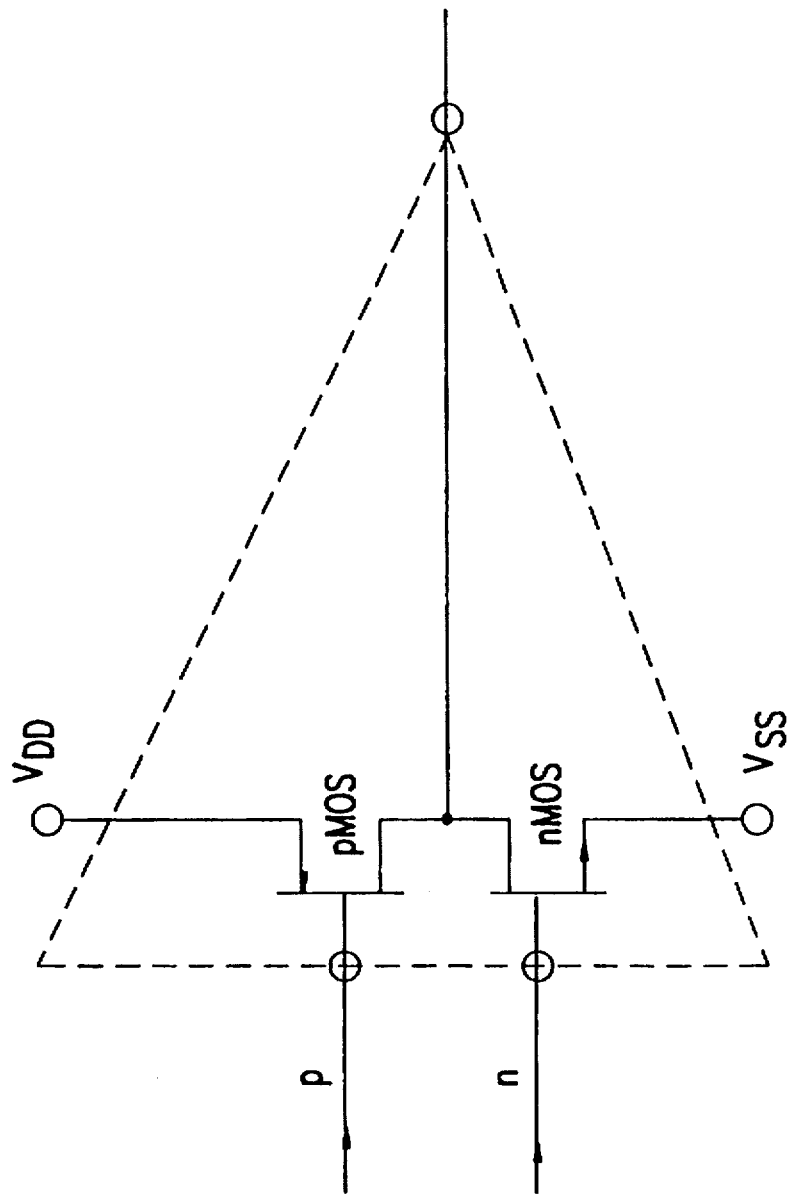
FIG. 4 is a schematic diagram of an inverter adapted for use in the VCO of FIG. 3.

Referring to FIGS. 3 and 4, VCOs 36, 38 have a cascade of odd (n) and even (m) CMOS inverters $300_1, \ldots, 300_n$ (here n=5) and $304_1, \ldots, 304_m$ (here m=4). The number of odd (n) inverters $300_1–300_n$ is greater than the number of even (m) inverters $304_1–304_n$. An exemplary one of the inverters is shown in FIG. 4. Thus, each one of the inverters is a differential amplifier having a p-input and an n-input. The output of each one of the amplifiers is connected to: the n-input of the next succeeding amplifier to provide a closed loop, or ring oscillator; and, the p-input of an amplifier positioned an even number of amplifier stages forward of such next succeeding amplifier. Each amplifier in the ring includes an n channel transistor (nMOS transistor) connected in a totem pole arrangement, to a p channel transistor (pMOS transistor). The gate of the nMOS transistor provides the non-inverting input and the gate of the pMOS transistor provides the inverting input. The source and drain paths of the pMOS and nMOS transistors are connected together to provide an output for the amplifier.

The outputs of the nth inverter $300_n$, here $300_5$, and the (n+m)th inverter $304_m$, here $304_4$, are connected to an interpolating circuit 306. The interpolating circuit 306 includes a pair of depletion mode field effect transistors 305, 307 arranged as a potentiometer to combine the signals produced in an inner, fast loop 308 and a slower outer loop 310. That is, the cascade of n inverters thus forms an inner ring 308, and the cascade of (n+m) inverters forms an outer ring 310.

The total propagation delay through inner ring 308 determines a highest frequency of oscillation of VCOs 36, 38, i.e., a longer delay in each inverter 300 or a larger number of inverters 300 decreases the maximum frequency of oscillation of VCOs 36, 38. Similarly, the total propagation delay through outer ring 310 (including all n+m inverters) determines a lowest frequency of oscillation of VCOs 36, 38.

Circuit 306 produces a weighted vector sum of the signals at the output of the nth inverter $300_n$ and the (n+m)th inverter $304_m$ to control the total propagation delay through VCOs 38, 76, and thus the frequency of oscillation, in response to a control voltage. VCOs 38, 76 are preferably designed to oscillate between 700 MHz and 1 GHz.

Referring to FIG. 4, each inverter 300, 304 includes a relatively slow, pMOS transistor and a relatively fast nMOS transistor. As shown, in order to increase the highest frequency of oscillation without decreasing the number of inverters, VCOs 38, 76 include a look-ahead mechanism. In the inner ring of n inverters $300_1, \ldots, 300_n$, the output of each inverter is fed forward by two, or more generally, an even number of stages. In other words, the output of each inverter is fed into the n-input, or gate of the nMOS transistor, of the successive inverter, and the gate of the pMOS transistor in such inverter in the inner ring is fed by a signal an even number of stages before it. In the example shown, five stage inner ring 308 in VCOs 38, 76 has a two stage look-ahead. This drives the relatively slow pMOS gate 350 of each inverter in anticipation of the faster response in nMOS gate 352, and decreases the total propagation delay of inner ring 308.

More specifically, the output of inverter $300_1$ is fed to the n-input of inverter $300_2$ and to the p-input of inverter $300_4$. The output of inverter $300_2$ is fed to the n-input of inverter $300_3$ and to the p-input of inverter $300_5$. The output of inverter $300_3$ is fed to the n-input of inverter $300_4$ and to the p-input of inverter $300_1$. The output of inverter $300_4$ is fed to the n-input of inverter $300_5$ and to the p-input of inverter $300_2$. The output of inverter $300_5$ is fed, via the circuit 306, to the n-input of inverter $300_1$ and to the p-input of inverter $300_3$.

To put it still another way, each one of the inverters is a differential amplifier having a p-input and an n-input. The output of each one of the amplifiers is connected to: the n-input of the next succeeding amplifier to provide a closed loop, or ring oscillator; and, the p-input of an amplifier positioned an even number of amplifier stages forward of such next succeeding amplifier. Each amplifier in the ring includes an n channel transistor (nMOS transistor) connected in a totem pole arrangement, to a p channel transistor (pMOS transistor). The gate of the nMOS transistor provides the n-input and gate of the pMOS transistor provides the p-input. The source and drain paths of the pMOS and nMOS transistors are connected together to provide an output for the amplifier. With such arrangement, because the gate of the more slowly responding pMOS transistor is driven before the gate of the nMOS transistor the oscillator is adapted to operate at a higher frequency of oscillation. That is, one input of the differential amplifier is driven prematurely.

Figure 5:
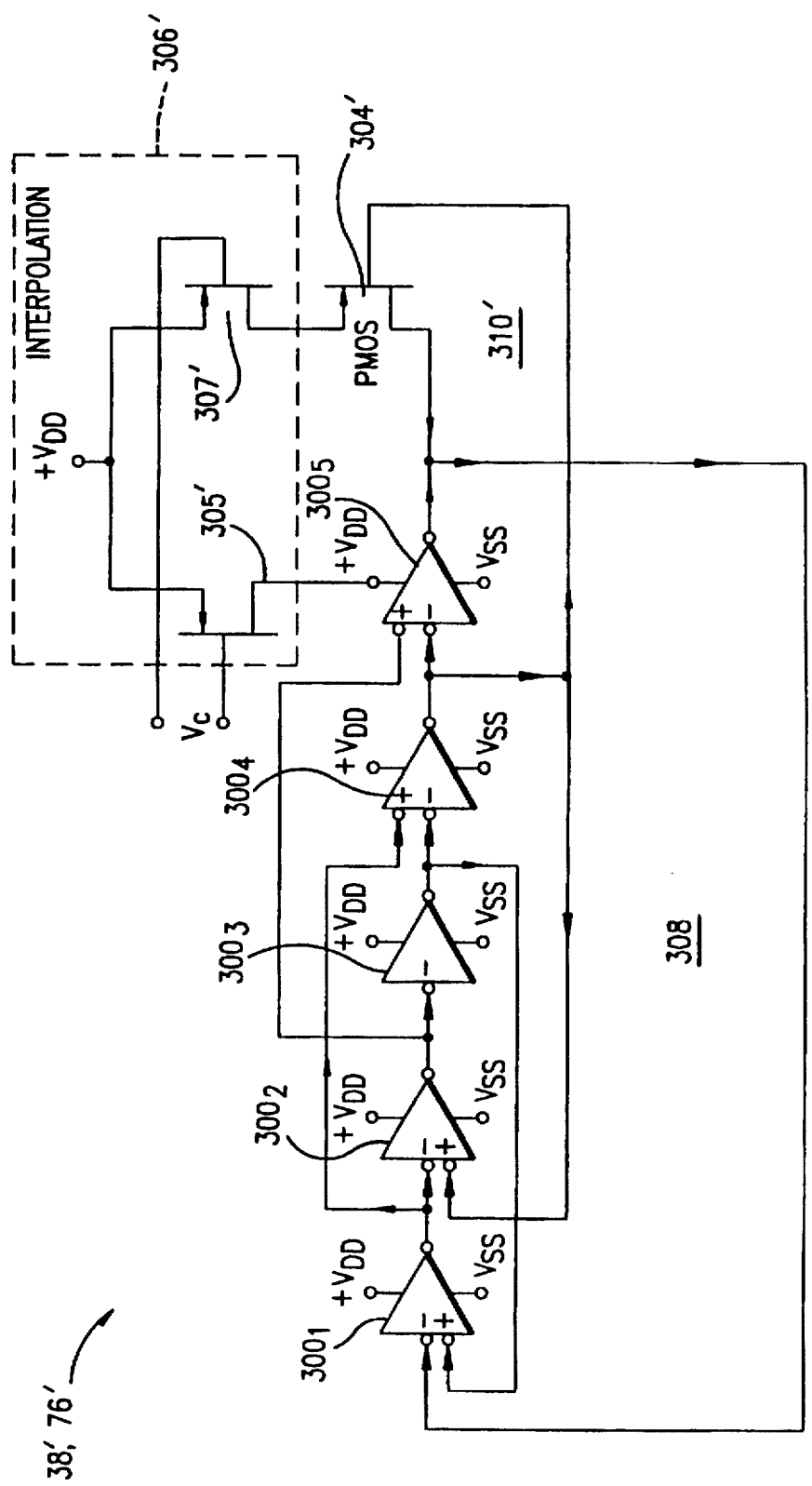
FIG. 5 is a block diagram of a VCO according to an alternative embodiment of the invention, such VCO being adapted for use in the transceiver of FIG. 1.

Alternatively, as shown in FIG. 5, in VCOs 38', 76' the outer loop 310' instead of having an even number of cascaded inverters $304_1–304_4$, as in VCOs 38, 76 (FIG. 4), has a pMOS transistor 304' as shown. The pMOS transistor 304' is not connected as an inverter but rather shares the nMOS transistor of inverter $300_5$. The drain of the pMOS transistor in inverter $300_5$ and the drain of pMOS transistor 304' are coupled to the interpolation circuit 306', as shown. Circuit 306 includes a pair of field effect transistors 305', 307', having their sources connected, respectively, to the drain of the pMOS transistor of inverter $300_5$ and the drain of pMOS transistor. Thus, instead of creating a difference in delay between the two rings by providing a different number of inverters in each ring (as in VCOs 38, 76), the delay in the two rings is modified by slow transistor 304' and the fast nMOS transistor in inverter $300_5$. Interpolator 306 mixes the outputs in response to a control voltage fed to the gates of transistors 305', 307 to vary the frequency of oscillation of VCOs 38', 76'. VCOs 38', 76' thus provide a higher maximum frequency than VCO 38, 76 by removing the two inverters in the outer ring of VCOs 38, 76 that capacitively load the five inverters in the inner ring.

The look-ahead mechanism can be used to increase the maximum frequency of oscillation in any ring oscillator with components having differential delays.

LOW PASS FILTER 45

Figure 6A:
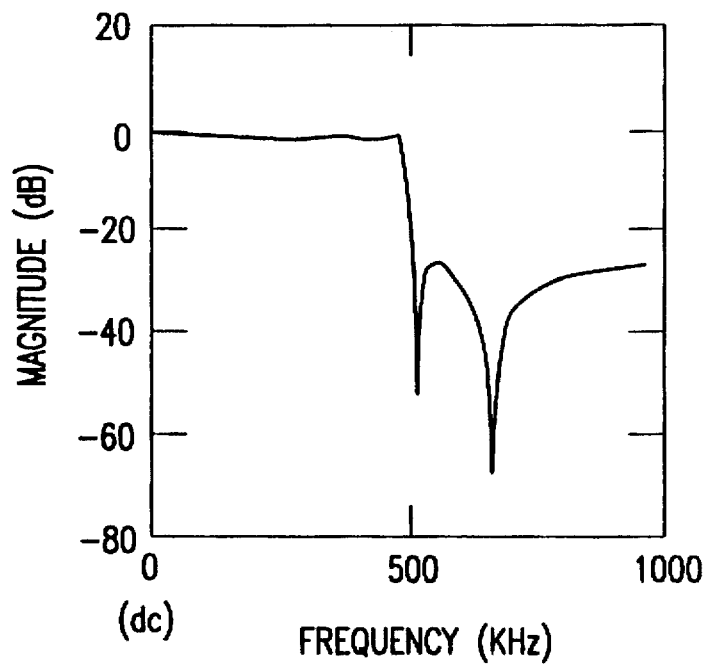
FIGS. 6A, 6B and 6C are the frequency spectrum, time delay and step response characteristics of a low pass filter used in the downconverter of the transceiver of FIG. 1.
Figure 6B:
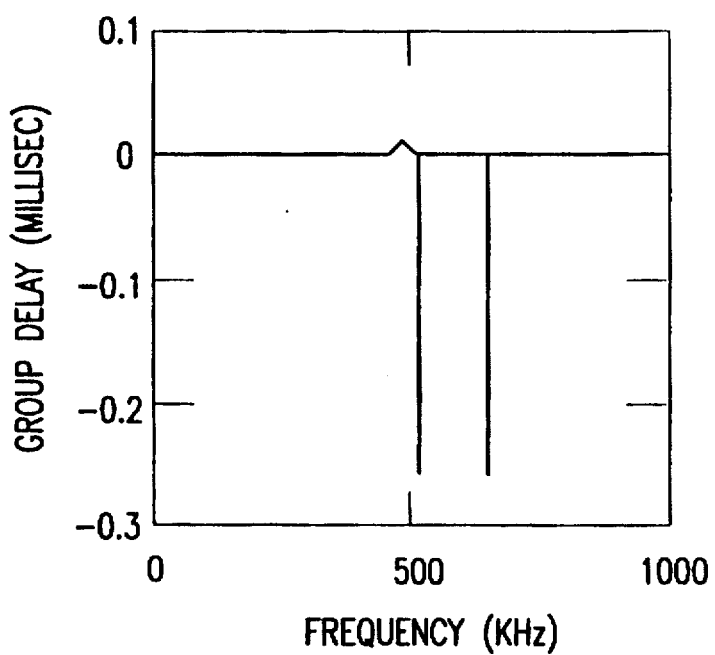
Figure 6C:
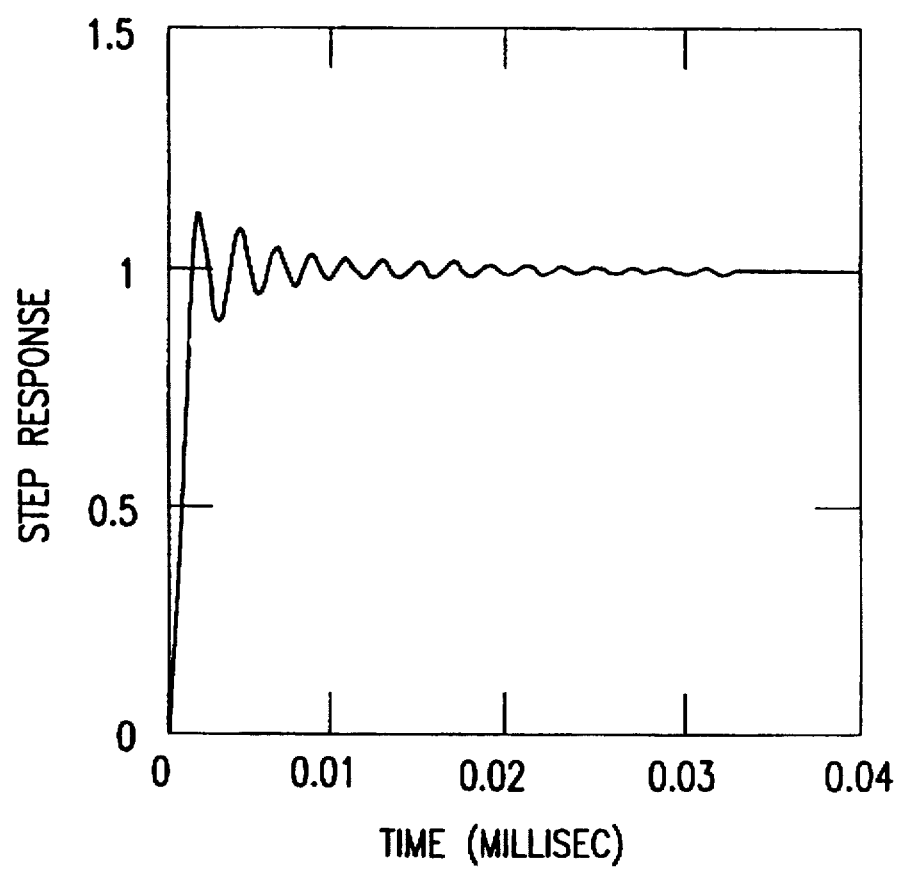

Referring to FIGS. 6A through 6C, the frequency spectrum, group delay, and step response of low pass filter 45 (FIG. 2) are shown, respectively. The frequency spectrum is centered at dc and has here a bandwidth of 480 MHz to isolate the frequency channel of interest, i.e., the selected channel downconverted to the intermediate frequency, $f_{if}$= 250 MHZ. The low pass filter is an elliptic filter with 1 dB in-band ripple, a 480 kHz 3 dB bandwidth, and a stopband (with greater than or equal to 25 dB rejection) of 520 kHz.

A MATLAB program for designing and analyzing the filter is given in Appendix A. The output $r_i(t)$ of the filter is approximately equal to the bandpass signal $r_s(t)$ shifted to $f_{if}$ and scaled by the gain of the low pass filter.

LOW NOISE AMPLIFIER 40 AND COARSE AGC CIRCUIT 48

Referring to FIG. 1, low noise amplifier 40 and coarse AGC circuit 48 together adjust the gain of the signal, $a_n$, produced at the output of coarse AGC circuit 54 in 3 dB steps, to maintain the received energy within the transceiver's dynamic range of 60 dB. More particularly, AGC control 58 and low pass filter 57, shown in detail in FIG. 7, produce a signal on line 61 to cause coarse AGC 48 and amplifier 40 to adjust the gain of the received signal by one step in the appropriate direction when power of the signal, v(n), produced by the Hilbert-Transform-pair demodulator 56 is outside the dynamic range of fine AGC circuit 54.

Coarse AGC circuit 48 and amplifier 40 minimize the effect of quantization noise and prevent arithmetic overflow (due to too large signals) in digital signal processor 50. Coarse AGC circuit 48 and ADC 52 are synchronized to different phases of the reference frequency ($f_r$) to ensure adequate settling time for coarse AGC circuit 48 and amplifier 40.

ANALOG TO DIGITAL CONVERTER (ADC) 52

The ADC conversion rate exceeds $2f_b+\delta/2$, where $\delta$ is the adjacent channel separation in R(f) (e.g. 1 MHz), and $2f_b$ is the bandwidth of each channel 200 (FIG. 2A). The ADC 52 preferably has a conversion rate of 1 MHz. This ensures that the conversion rate is larger than twice the highest frequency component in its input $r_r(t)$, or the Nyquist frequency.

Referring to FIG. 1, the sampling frequency is provided to ADC 52 by divider 53 dividing the reference frequency (20 MHz) from oscillator 30 by 20. The ADC 52 also preferably encodes signal samples in a 2's complement format in 10 bits or more. A 10 bit ADC has a quantization signal to noise ratio (SNR) of better than 55 dB, which is adequate. All subsequent operations in DSP 50 maintain a 10 bit accuracy in 2's complement format to match ADC 52. All numbers are represented in fixed point fractional format in the range [−1,1).

FINE AGC CIRCUIT 54

Figure 7:
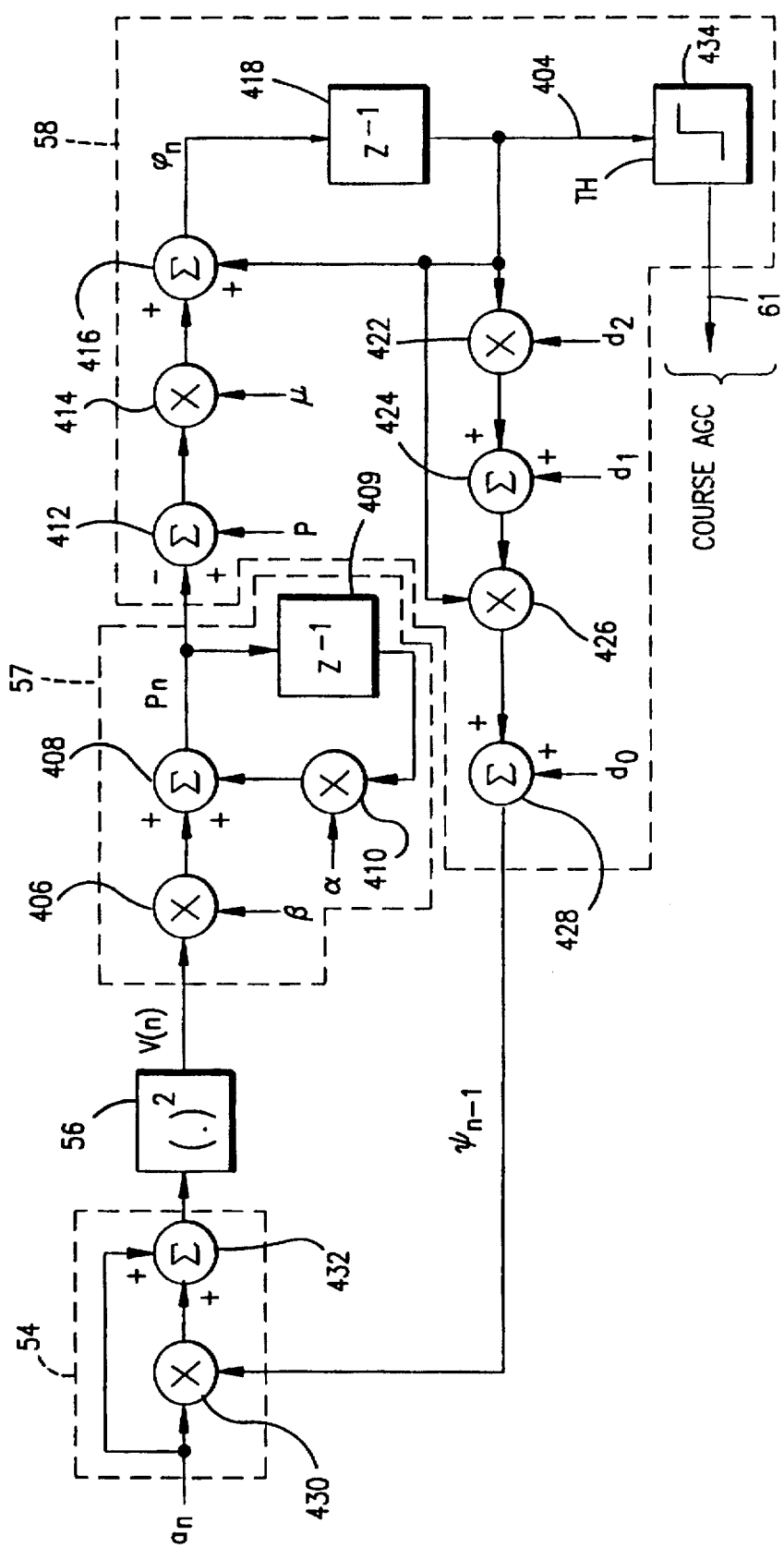
FIG. 7 is a diagram useful in understanding the operation of a coarse and fine automatic gain control (AGC) circuits used in the transceiver of FIG. 1.

Referring to FIGS. 1 and 7, fine AGC circuit 54 causes the power in the signal, v(n), produced by the Hilbert-Transform-pair Demodulator 56 to track a constant reference value P, and thus minimizes the effect of arithmetic truncation errors in the Hilbert-Transform-pair demodulator 56.

Fine AGC circuit 54 multiplies digitized output $a_n$ of the ADC 52 by a factor $\lambda_{n-1}$. A low pass filter 57 calculates the resulting average energy $p_n$ from the output v(n) of the Hilbert-Transform-pair demodulator 56. The fine AGC control 58 then iteratively adapts λ to cause the average energy $p_n$ to track a constant reference P. The iterative solution avoids computational problems associated with fixed point division (e.g., inefficiency and numeric overflow) in determining the scaling factor ($\lambda_n=P/p_n$).

Because DSP 50 (FIG. 1) functions in fixed point arithmetic in the range [−1,1), the gain λ is transformed as follows:

$$\lambda_n \in [\sqrt{0.5}, \sqrt{2}) \tag{11}$$

$$\lambda_n = 1 + \psi_n; \sqrt{0.5} - 1 \leq \psi_n < \sqrt{2} - 1$$

$$1 + \phi_n = (1 + \psi_n)^2; -0.5 \leq \phi_n < 1$$

The gain λ is thus limited to 3 dB.

Referring to FIG. 7, low pass filter 57 has a multiplier 406 multiplying v(n) by a factor β. The output of multiplier 406 is coupled to an adder 408. The output of the adder 408 is fed back through a one-cycle delay 409 and a multiplier 410 multiplying its input by α. The output $p_n$ of the low pass filter 57 is thus:

$$p_n = \alpha p_{n-1} + \beta v_n \tag{12}$$

The factors α and β are stored in RAM 25 by microprocessor 18 (FIG. 1).

The average power $p_n$ is fed to an adder 412 that subtracts $p_n$ from the constant reference power P to generate an error signal. The output of adder 412, the error signal, is then multiplied by the step size of the iteration, μ, in multiplier 414. The step size and the reference power P are stored in RAM 25 by microprocessor 18 (FIG. 1).

An adder 416 sums the output of multiplier 414 with a delayed output $\phi_{n-1}$ of adder 416 from delay 418 to produce:

$$\phi_n = \phi_{n-1} + \mu(P - p_n), -0.5 \leq \phi_n < 1 \tag{13}$$

where:

$$\psi_n = \lambda_n - 1 = \sqrt{1 + \phi_n} - 1 \tag{14}$$

Next, $\psi_{n-1}$ is computed from $\phi_{n-1}$ with a polynomial approximation using the least-square technique. Multiplier 422 multiplies the output of delay 418 ($\phi_{n-1}$) by $d_2$, and adder 424 sums the output of multiplier 422 with $d_1$. The output of adder 424 is then multiplied by the output of delay 418 in multiplier 426, and summed with $d_0$ in adder 428. The output of adder 428 is $\psi_{n-1}$, given by:

$$\psi_{n-1} = d_2 \phi_{n-1}^2 + d_1 \phi_{n-1} + d_0 \approx \sqrt{1 + \phi_n} - 1, -0.5 \leq \phi_{n-1} < 1 \tag{15}$$

where $$d_2 = -0.2025847; d_1 = 0.565846; d_0 = 0.0102634 \tag{16}$$

The constants in Equation (13) are all stored in RAM 25 by microprocessor 18.

The fine AGC circuit 54 calculates $\lambda_{n-1}$ from $\psi_{n-1}$ by multiplying $a_n$ by $\psi_{n-1}$ in multiplier 430, and adding $a_n$ to the output of multiplier 430 in adder 432.

The AGC component 404, i.e., the output of delay 418, (i.e., $\phi_{n-1}$) is compared with a predetermined threshold level, TH, in threshold device 434. When threshold device 434 determines that $\phi_{n-1}$ exceeds the predetermined threshold level, TH, indicating that P differs from $p_{n-1}$ by more than 3 dB, an AGC component signal is produced on line 61 by the threshold device 434 to inform coarse AGC 78 and amplifier 69 to adjust the gain of the received signal by 3 dB in the appropriate direction. AGC component 404 then resets parameter $\psi_{n-1}$ to zero, and the gain λ is iteratively readjusted to the new received power $p_n$.

The approximation error in calculating $\psi_{n-1}$ with Equation (15) is no more than 2% over the entire interval of interest. In addition, $\psi_{n-1}$ is guaranteed to converge as long as the power $p_n$ varies slowly relative to the time of convergence of fine AGC circuit 54, i.e., the received data $a_n$ is approximately wide-sense stationary.

HILBERT-TRANSFORM-PAIR FILTER SECTION 55

Figure 8:
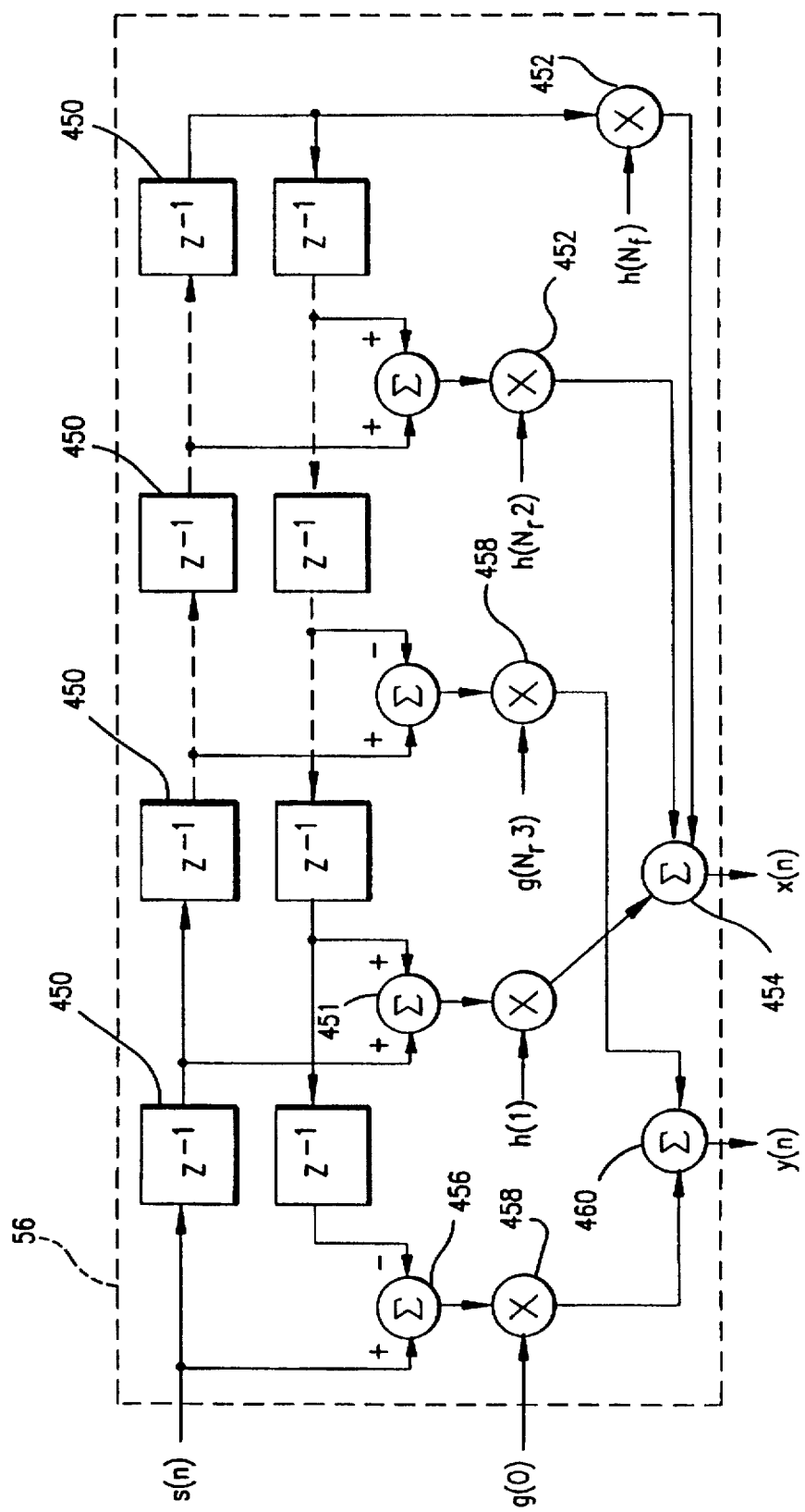
FIG. 8 is a diagram showing a Hilbert-Transform-pair filter section used in the transceiver of FIG.1.

Referring now to FIG. 8, Hilbert-transform-pair filters 92, 94 of section 55 (FIG. 1) are each finite impulse response (FIR) filters with bandwidth $$[f_1, f_h] = [f_{if} - (f_b + 80 \text{ kHz}), f_{if} + (f_b + 80 \text{ kHz})] \tag{17}$$

where $2f_b$ is the bandwidth of each individual channel 200 in the spectrum R(f) of the received signal r(t) (FIG. 2A).

Hilbert-transform-pair filters 92, 94 in filter section 55 thus account for an 80 kHz error range in the downconversion of the bandpass spectrum to $f_{if}$. In other words, the Hilbert-transform-pair preserves information that is shifted from the intermediate frequency by 80 kHz plus half the channel bandwidth.

Filters 92, 94 have $2N_f+1$ tap coefficients h(n), g(n), given by:

$$h(n)=2b \sin c[(n-N_f)b] \cos [2\pi(n-N_f)d]w(n-N_f) \quad (18)$$

$$g(n)=2b \sin c[(n-N_f)b] \sin [2\pi(n-N_f)d]w(n-N_f) \quad (19)$$

where $$0 \leq n \leq 2N_f, b = \frac{f_h - f_l}{f_p} ; d = \frac{f_h + f_l}{2f_p} = \frac{f_{if}}{f_p} \quad (20)$$

and $f_p$ is the sampling rate of ADC 80. The Hamming window w(m) is given by:

$$w(m) = 0.54 + 0.46\cos\frac{m\pi}{N_f} ; |m| \leq N_f \quad (21)$$

$$= 0; \text{elsewhere}$$

The Hamming window smooths the magnitude response of the Hilbert-transform-pair filters 92, 94 to eliminate passband ripples due to the well-known Gibb's phenomenon.

When the optimal intermediate frequency ($f_{if}=\delta/4$) is used at a sampling rate of $f_p=4f_{if}=1$ MHz, the tap coefficients reduce to:

$$h(n) = (-1)^k 2b\text{sinc}(2kb)w(2k); n = \quad (22)$$

$$N_f + 2k; -\frac{N_f}{2} \leq k \leq \frac{N_f}{2}$$

$$= 0; \text{elsewhere}$$

$$h(n) = h(2n_f - n); 0 \leq n \leq 2N_f$$

$$g(n) = (-1)^{k+1} 2b\text{sinc}[(2k-1)b]w(2k-1); n = \quad (23)$$

$$N_f + 2k - 1; \frac{1-N_f}{2} \leq k \leq \frac{1+N_f}{2}$$

$$= 0; \text{elsewhere}$$

$$g(n) = -g(2n_f - n); 0 \leq n \leq 2N_f$$

As shown in FIG. 8, at the optimal intermediate frequency and with $N_f$ odd, Hilbert-transform-pair filters 92, 94 share $2N_f$ cascaded delays 450. Outputs of the delays are summed in adders 451 and multiplied by the appropriate tap coefficient h(n) in multipliers 452. The outputs of multipliers 452 are summed in adder 454 to produce the output x(n) of filter 92. Outputs of the delays 450 are also summed in adders 456 multiplied by the appropriate tap coefficient g(n) in multipliers 458. The outputs of adders 456 are summed in adder 460 to produce the output y(n) of filter 94.

The in-phase and quadrature outputs x(n), y(n) are thus:

$$x(n) = h(N_f)s(n - N_f) + \quad (24)$$

$$\sum_{k=1}^{K} h(N_f + 2k) [s(n - N_f - 2K) + s(n - N_f + 2K)]$$

where K is the largest integer less than or equal to $N_f/2$, and $$y(n) = \sum_{k=1}^{L} g(N_f + 2k - 1) [s(n - N_f - 2k + 1) - s(n - N_f + 2k - 1)] \quad (25)$$

where L is the largest integer less than or equal to $(N_f+1)/2$.

In a one-micron CMOS implementation of filters 92, 94, it is estimated that only $(N_f+1)/8$, 10-bit multipliers are employed. This is because each multiplier performs a multiplication in about 125 ns, and the sampling interval is 1 microsecond. For example, for Hilbert-transform-pair filters with 31 tap coefficients ($N_f=15$), only one multiplier per filter is needed. Similarly, $2N_f-1$ additions are performed in the filter operations.

Figure 9A:
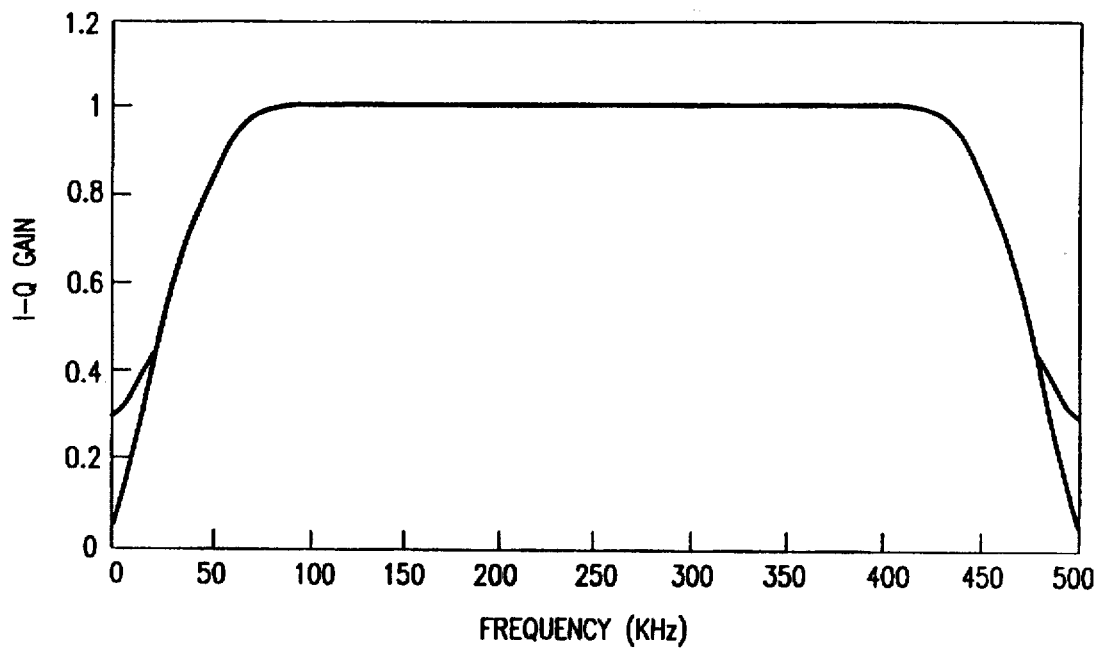
FIGS. 9A and 9B are graphs representing the gain and relative phase as a function of frequency of the filters of FIG. 8; and, FIGS. 10A through 10C, are the Fourier transforms X'(f), Y'(f) of the outputs of the Hilbert-Transform-pair filter section.
Figure 9B:
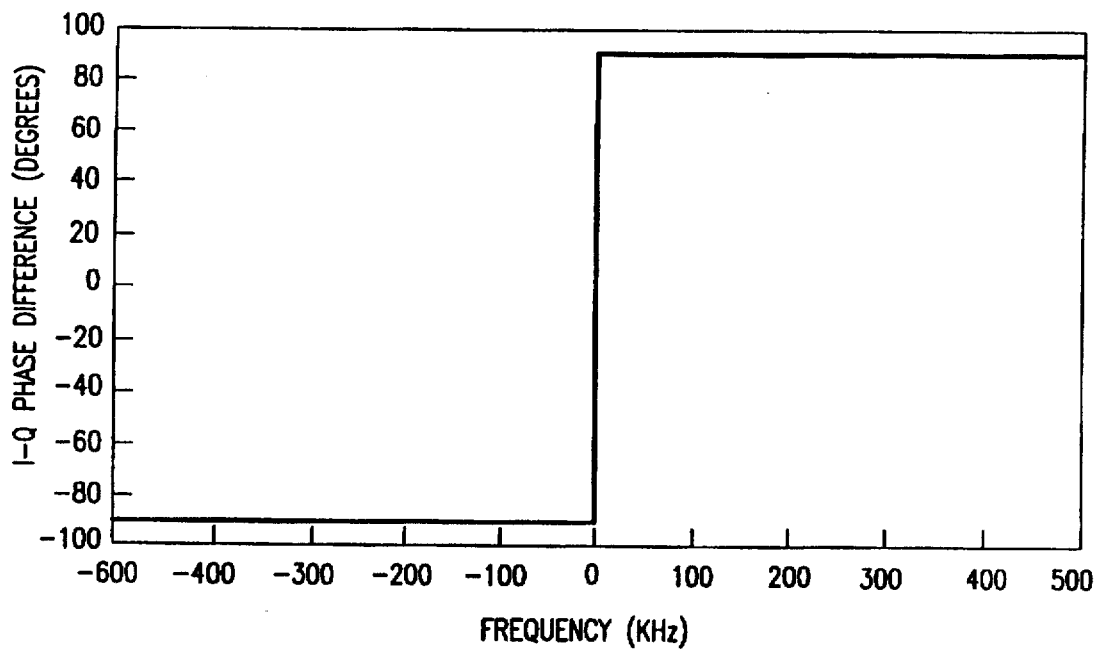

Referring to FIGS. 9A and 9B, filters 92, 94 have matched in-band magnitudes and are +90 degrees out of phase for positive frequencies and −90 degrees out of phase for negative frequencies. Any imbalance in the magnitude of the filters is less than −40 dB. Filters 92, 94 achieve a worst-case stopband rejection (at a 256 kilobits per second data rate) of at least 10 dB. Together with low pass filter 76, the total worst-case adjacent channel rejection exceeds 35 dB.

Figure 10A:
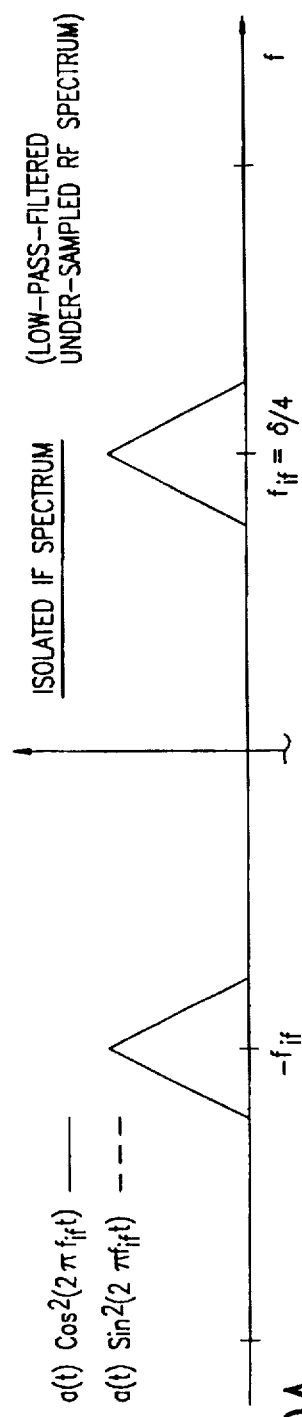
Figure 10B:
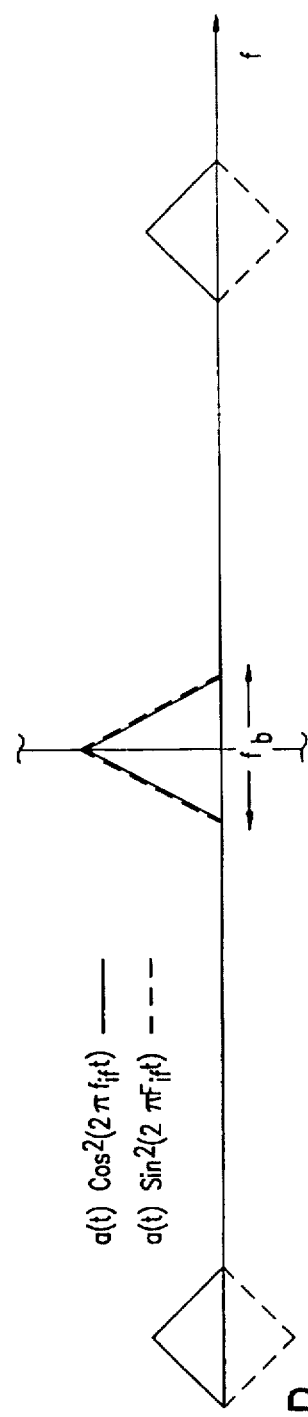
Figure 10C:
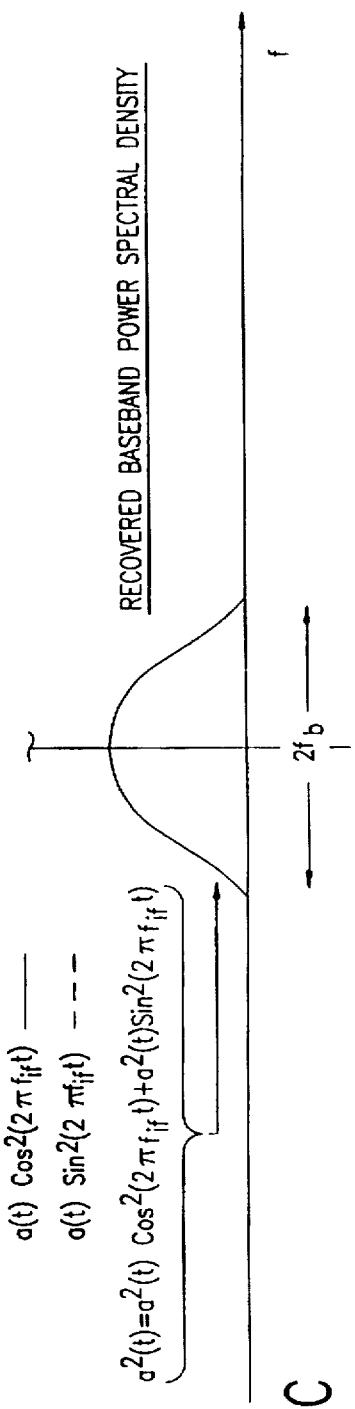

Referring to FIGS. 10A through 10C, an analog representation of the Fourier transforms X'(f), Y'(f) of the square of the filter outputs, $x^2(n)$ and $y^2(n)$ indicates schematically that the outputs are normal vector components of the magnitude of s(n). Squaring and adding the outputs thus produces the baseband power in s(n) (equal to v(n)).

A MATLAB program for the design and analysis of filters 92, 94 is given in Appendix B.

Other embodiments are within the spirit and scope of the appended claims. For example, fine AGC circuit 54 can be designed to adjust the gain to within more than 3 dB, e.g., with a gain $\lambda=\psi+1+1$, with additional adders. Fine AGC circuit 54 could also be implemented in a floating point digital signal processor, at a greater cost. Further, the inner loop 308 may be used without outer loop 310 to provide a ring oscillator without voltage control.

What is claimed is:

1. A dual automatic gain control receiver, comprising:

a digital signal processor;

a coarse automatic gain control circuit, fed by a low pass filter passed intermediate frequency signals and gain responsive to a coarse control output of said digital signal processor, for coarse adjusting a gain of the coarse automatic gain control circuit;

an analog-to-digital converter associated with said coarse automatic gain control circuit for accepting an output signals of the coarse automatic gain control circuit and generating digital signals; and, a fine automatic gain control circuit being fed by the digital signals generated by said analog-to-digital converter, and gain responsive to a fine control output of the digital signal processor, for fine adjusting a gain of the digital signals, wherein the receiver includes a demodulator and wherein said demodulator provides a demodulator output signal, said demodulator output signal being used to generate the coarse and fine control outputs of the digital signal processor.

2. The receiver according to claim 1, wherein the demodulator comprises a pair of filters having Hilbert-Transform relationship with respect to each other.

3. The receiver according to claim 1, wherein the digital signal processor functions in conjunction with said demodulator.

* * * * *